United States Patent [19]

St. John

[11] Patent Number: 5,402,008

[45] Date of Patent: Mar. 28, 1995

[54] AUTOMATIC BACKUP BATTERY CONNECTION

[75] Inventor: Pamela M. St. John, Prairie City, Iowa

[73] Assignee: Maytag Corporation, Newton, Iowa

[21] Appl. No.: 198,674

[22] Filed: Feb. 18, 1994

Related U.S. Application Data

[63] Continuation of Ser. No. 870,597, Apr. 17, 1992, abandoned.

[51] Int. Cl.⁶ .................................................. H02J 9/00
[52] U.S. Cl. ........................................ 307/64; 439/188
[58] Field of Search ......................... 439/507, 924, 188; 307/64, 66, 113, 140; 365/228, 229; 200/43.04, 43.05; 361/400, 88

[56] References Cited

U.S. PATENT DOCUMENTS

| | | | |
|---|---|---|---|
| 3,191,095 | 6/1965 | Hefti | 361/88 |
| 4,119,948 | 10/1978 | Ward . | |
| 4,146,778 | 3/1979 | Wain . | |
| 4,201,907 | 5/1980 | Otten . | |
| 4,520,451 | 5/1985 | McLaughlin . | |
| 4,598,378 | 7/1986 | Giacomo . | |
| 4,704,599 | 11/1987 | Kimmel | 307/140 |
| 4,799,185 | 1/1989 | Taylor . | |
| 4,907,250 | 3/1990 | Ricks . | |
| 4,985,870 | 1/1991 | Faraci | 365/228 |
| 5,181,858 | 1/1993 | Matz | 439/188 |

Primary Examiner—Jeffrey A. Gaffin
Assistant Examiner—Peter Ganjoo
Attorney, Agent, or Firm—Willian Brinks Hofer Gilson & Lione

[57] ABSTRACT

A method and apparatus are described for selectively activating a secondary power source, such as a backup battery, for an electronic device, such as dynamic RAM. A connector is described in conjunction with a circuit board including a first contact coupled to the backup battery, and a second contact coupled to the corresponding input for backup power associated with an electronic device. In this state, an open circuit is presented such that the battery is isolated from the electronic device. A socket is described for cooperating with the connector, which includes mating contacts corresponding to the first and second contacts previously described, and a shunt for establishing electrical continuity between these mating contacts. In this manner, a completed circuit is established between the battery and the electronic device when the socket is attached. A bypass connection is also described for maintaining connection between the battery and the electronic device independent of the socket, so that the circuit board may later be removed without threatening loss of accumulated memory contents.

9 Claims, 1 Drawing Sheet

AUTOMATIC BACKUP BATTERY CONNECTION

This application is a continuation of application Ser. No. 07/870,597, filed Apr. 17, 1992, now abandoned.

BACKGROUND OF THE INVENTION

1. Field of the Invention

This invention relates to a method and apparatus for selectively activating a secondary power source, such as a backup battery, for an electronic circuit. In particular, methods and apparatus for activating an on-board backup battery to retain the contents of electronic memory are disclosed wherein the battery remains disconnected during manufacture and shipment, and is automatically connected when the corresponding circuit board is placed in service.

2. Description of the Prior ARt

Many common forms of electronic memory must be periodically refreshed or otherwise require a source of electrical energy to maintain the memory contents during quiescent periods. To prevent loss of memory contents during periods when the primary power supply to the electronics fails, it is common to provide a separate power source for the memory retention function. In general, the power required to retain the contents of electronic memory is less than the power required to otherwise operate or update the memory. Thus a substantially smaller, lower capacity power source is generally sufficient to retain the memory contents, and is typically provided by relatively small disposable or rechargeable batteries. For convenience, these are typically incorporated onto to the circuit board or into the electronics module including the memory device itself.

Although the backup power requirement for memory devices is typically small, it is possible for the backup battery to be depleted by long-term use. This is a particular concern where the battery is permanently connected and the circuit board is not immediately installed in a host system or attached to a primary power supply. A significant portion of the total energy available from the battery may be wasted by unnecessarily powering the memory retention function between the time of manufacture and first use, or for extended periods in general. While the battery may not be fully depleted during such periods, less capacity will remain for beneficial use after the electronics have been installed in a host system or otherwise put into use. For example, a lithium battery may be able to continuously power the memory retention function of memory registers of a typical microprocessor for two years or more. However, if the circuit is not installed for use for one year, approximately one half of the usable battery power may be depleted before the circuit is put to use. Ultimate exhaustion of the backup battery may therefore occur sooner than if a "fresh" battery were in place when the electronics were installed.

Because failure of the backup power source may result in loss of important programming and data information, it is highly desirable to minimize the chance for backup battery failure or exhaustion, and to lengthen the shelf an service life of the battery.

Various techniques have been used to provide some level of safeguard against premature failure. For example, it is common to couple a backup power source to a memory device only during periods of failure of a primary power source. Various isolation devices (such as diode coupling) may be employed for this purpose, and modern memory and microprocessor devices typically provide for isolation of the backup power source while the primary power source is active. Although effective in reducing current drain on the backup battery and thus extending its life, these techniques are not effective to guard against premature depletion when the associated circuit is disconnected from a source of primary power for extended times, such as prior to installation of a circuit board into a host system.

To overcome this problem, removable batteries may be employed so that a fresh backup battery is installed only when the associated circuit board or module is installed in a host system or otherwise configured for operation. However, this technique has the disadvantage of requiring the installer to maintain an inventory of suitable batteries, and requires an additional step during installation. If the installer does not have an appropriate battery available, or otherwise fails to install the battery or to install it correctly, the backup function will not be available and data loss may therefore occur.

Switches or jumpers on the board may similarly be used to selectively connect the backup battery only when desired. However, there remains the danger that the switch or jumper is not properly set when the electronics are installed (resulting in potential loss of data), or that they are erroneously set to connect the battery during quiescent shelf storage of the electronics (depleting the battery prematurely).

Finally, numerous techniques have been developed for providing a rechargeable backup power source. In this manner, the battery is recharged while the primary source is connected, and therefore may retain a higher percentage of its available capacity for a longer period of time. However, rechargeable batteries typically have a lower power density than comparably sized disposable batteries (such as lithium batteries), and require additional circuitry to provide the recharging function. Further, the battery must be initially charged before installation if the backup is to be effective upon initial activation of the associated circuitry, requiring yet another processing step. Finally, even a fully charged battery my be depleted or fail prematurely if the associated circuits are not connected to a source of primary power for an extended period of time, such as after manufacture and before first use.

SUMMARY OF THE INVENTION

Accordingly, it is an object of the present invention to provide a secondary power source for electronic devices (such as electronic memory) which is selectively activated only when the associated electronics unit (which may comprise, for example and without limitation, a circuit board or electronics module) is installed or otherwise connected for use (such as in a host system). In this manner, the secondary power source is not prematurely depleted prior to installation of the electronics unit, such as during the period between manufacture of the electronics unit and its installation. A further object is to provide automatic activation of the system when the electronics units is installed, without requiring special or additional steps by the installer. In general it is an object to provide such automatic activation by use of standard low cost components which do not add to the complexity or otherwise detract from the reliability of the associated electronics or host system.

It is a further object to provide means whereby the electronics unit may subsequently be removed from the host system without deactivating the backup power source. These and other objects shall be apparent in light of the present specification.

To achieve the aforementioned objects, in association with an electronics unit (such as a circuit board or module) including electronic devices (such as memory devices) which require constant or periodic electrical supply (such as to retain memory contents) and a secondary (backup) power source to provide such electrical power during periods when a primary power supply is disconnected or failed, means are provided for connecting the secondary power source to the electronic devices only when the electronics unit is installed in a host device or otherwise connected for intended use. In a preferred embodiment, a circuit board or module is provided with a first connector having a plurality of individual contacts, such as edge connector pads. A first of the contacts is functionally coupled to one terminal of the secondary power supply, and a second of the contacts is functionally coupled to the corresponding input for backup power of the associated electronic devices. The first and second contacts are normally electrically isolated from one another. An open circuit is therefore presented such that the battery is isolated from the electronic devices when the electronics unit is disconnected.

A second connector for cooperating with the first connector, such as a socket for receiving an edge connector on a circuit board, is also provided. The second connector includes first and second mating contacts for cooperating electrically with the first and second contacts of the first connector. Means for establishing electrical continuity between the first and second mating contacts of the second connector are provided, so that when the first connector is engaged with the second connector, a current path is established between the first and second contacts, thereby completing a circuit and connecting the secondary power source to the associated electronic devices.

In the preferred embodiment, a plurality of contacts are provided in association with the first connector, and a plurality of corresponding mating contacts are provided in association with the second connector. The function of a first and second of these is described above. Additional pairs of cooperating contacts may be used to connect signal and/or power leads to the electronics unit as desired. In particular, a source of primary electrical power may be supplied to the electronics unit by means of additional contacts. By incorporating the means for establishing electrical continuity into a connector whose attachment is required for normal operation of the electronics unit in this manner, it is assured that the backup power circuit will be closed whenever the electronics unit is properly installed for use, without requiring any additional steps or operations by the installer.

It may be desirable to remove the electronics unit from use after initial insertion, while maintaining integrity of the backup power source connection to retain accumulated memory contents. In a further embodiment, secondary means for circuit closure may be provided in parallel with the first and second contacts described above. For example, in a preferred embodiment an aperture may be provided in a circuit board for receiving the body of a conductive member. A first conductive pad functionally coupled to the first contact (and thus the secondary power source) is provided proximate to a portion of the periphery of the aperture, and a second conductive pad functionally coupled to the second contact (and thus the backup power supply input of the electronic devices) is provided proximate to another portion of the periphery of the aperture. The first and second conductive pads are normally isolated electrically from one another, so that an open circuit is presented. By inserting a conductive element (such as a metallic rivet) into the aperture such that both the first and second conductive pads are contacted, a closed circuit is established between the backup power source and the electronic devices independent of the connectors. After attachment of the conductive element in this manner, the circuit board may be disconnected from the second connector previously described without thereby isolating the secondary power source from the electronics. Other means for providing selective or temporary connection may similarly be employed, including temporary solder pads or conductive pins for cooperating with an electrically conductive jumper.

DETAILED DESCRIPTION OF THE PREFERRED EMBODIMENTS

Figure 1:
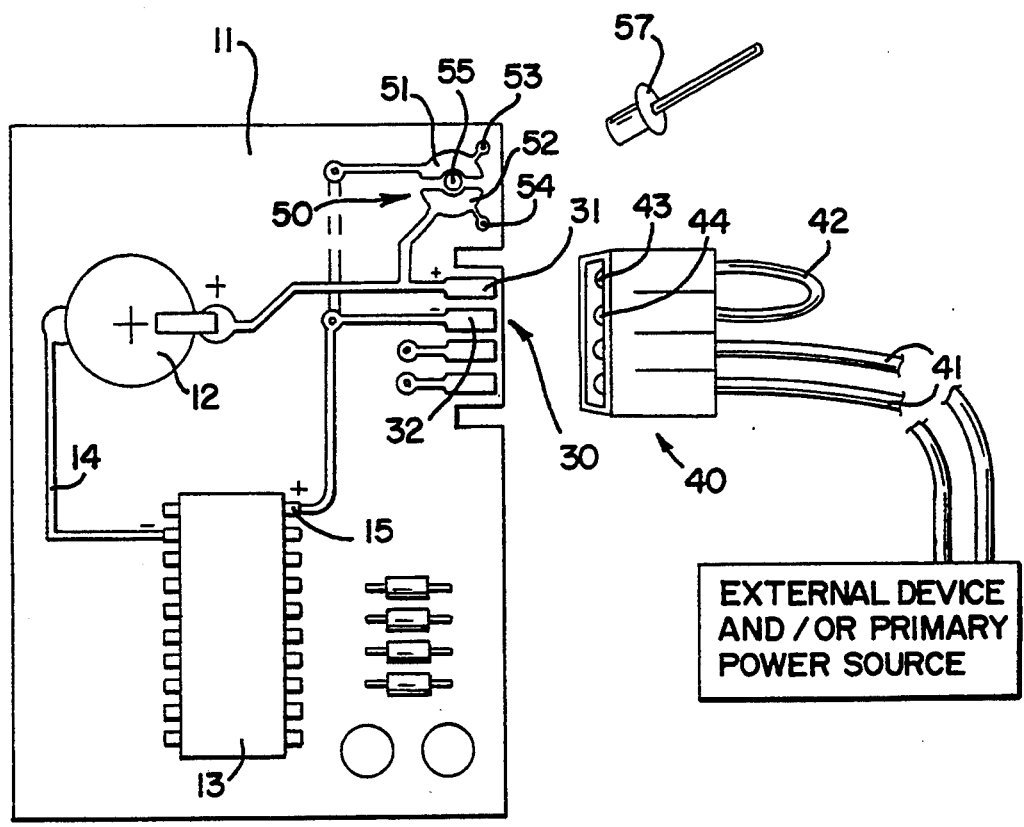
FIG. 1 is a representation of a preferred embodiment of the present invention utilizing a circuit board with an edge connector and a connection socket with an external shunt.

FIG. 1 illustrates a preferred embodiment of the present invention. A circuit board 11 provides support for one or more electronic devices, such as representative integrated circuit device 13. The circuit board illustrated may also be representative of a larger system, such as an electronics module.

The electronic devices 13 may include one or more devices requiring a constant (that is, continuous or periodic) power supply. For example, various forms of dynamic or volatile memory require a source of electrical power to maintain the memory contents. Representative devices would include, for example, dynamic RAM with refresh cycle, as well as devices (such as microprocessors) incorporating such dynamic or volatile memory circuits.

Devices of this type typically require substantially more power for normal operation than for the memory retention function. Primary power is therefore typically derived from ac line sources, or from high capacity battery supplies. In contrast, the lower power demands of the memory retention function may typically be satisfied by one or more small batteries which may be permanently installed as part of the overall electronics unit. In the preferred embodiment illustrated, the secondary power source comprises a lithium battery 12 permanently attached to, and supported by, circuit board 11. It should be understood, of course, that other forms of secondary power supplies and other similar configurations may also be employed without departing from the scope of the present invention.

The circuit board 11 is provided with a first connector 30. In the preferred embodiment illustrated, first connector 30 comprises a standard edge connector integral with circuit board 11 including a plurality of contacts such as printed circuit pads 31, 32. Other forms of contacts, and other forms of connectors, may similarly be employed without departing from the spirit of the invention, including connectors which are not integral with the circuit board or electronics unit itself.

A first of the contacts 31 is functionally coupled to a first pole of battery 12, as illustrated. Functional coupling may be accomplished by direct electrical connection of the elements as illustrated, or may incorporate active or passive elements (such as isolation or protective diodes, or filter devices) so long as an effective current path is established. A second of the contacts 32 is functionally connected to an input 15 of the electronic device 13 for receiving backup or secondary power. The polarity of input 15 corresponds with the previously mentioned pole of the battery 12 which is functionally coupled to the first contact 31. Finally, the second pole of battery 12 is functionally coupled 14 to the electronics element 13.

Contacts 31 and 32 are electrically isolated from one another, such that an open circuit exists between battery 12 and the input for backup power 15 associated with the electronic devices 13. In this manner, the battery is effectively isolated when the circuit board 11 is disconnected, and will not be prematurely depleted during the period after attachment to the circuit board and before the circuit board is inserted or otherwise connected for use.

A representative second connector 40 is illustrated, which is adapted to cooperate with the first connector 30. In the preferred embodiment, second connector 40 comprises a socket which matingly engages the edge connector of the circuit board 11. The second connector 40 includes a plurality of mating contacts which are adapted to electrically engage corresponding contacts of the first connector. In a preferred embodiment, the mating contacts may comprise spring wipers for contacting the printed circuit pads of the edge connector previously described. It is understood, of course, that other forms of electrical connectors may similarly be employed without departing from the scope of the present invention.

The mating contacts include first and second mating contacts 43, 44 which correspond to first and second contacts 31, 32 of the first connector. Means are provided for establishing electrical continuity between mating contacts 43, 44. For example, contacts 43, 44 may be electrically joined by means of an external shunt 42 as illustrated. Such an embodiment is particularly preferred in connection with standard forms of electrical connectors, since no specialized or additional hardware (other than the shunt 42) is required. However, it is understood that other means of establishing electrical continuity may similarly be employed. For example, mating contacts 43, 44 may be integrally formed of a single piece of conductive material, or may otherwise be functionally coupled.

Because mating contacts 43, 44 are functionally coupled, a current path is established between corresponding contacts 31, 32 when the second connector 40 is engaged with the first connector 30. For example, in the preferred embodiment illustrated shunt 42 closes the circuit between the battery 12 and the input for backup power 15 of the electronic device 13, thereby activating the backup power source when the second connector 40 is mated to the circuit board 11. Because shunt 42 is provided as part of the standard assembly of second connector 40, activation of the battery 12 does not require any specialized or additional steps by the installer.

First and second connectors 30, 40 may include, in addition to the first and second contacts described above, additional contact pairs. These may be used in standard manners to connect the circuit board 11 and associated electronics to external devices. In particular, in the preferred embodiment second connector 40 includes conductors 41 and associated connectors coupled to an external primary power supply. In this instance, it is necessary for second connector 40 to be attached to the circuit board 11 for the circuit board to be used, thereby assuring that the means for activating the backup power source described above will be engaged whenever the circuit board 11 is properly installed and connected for use. It is understood, of course, that other configurations are possible, and that other power or signal connections may be made in conjunction with first and second connectors 30, 40.

It is anticipated that during normal use the memory devices may accumulate important data. Should it become necessary to subsequently remove the electronics unit from a host system, requiring disconnection of second connector 40, it would be possible for such memory contents to be undesirably lost. Accordingly, in a further preferred embodiment, a secondary means for circuit closure, or bypass connection, 50 is provided in parallel with the first and second contacts. In general, the bypass connection includes a first conductive element functionally coupled to contact 31 (and therefore to battery 12) and a second conductive element functionally coupled to contact 32 (and therefore to input 15 for backup power). In the preferred embodiment illustrated, these conductive elements comprise first and second semi-circular contact pads 51, 52 formed as part of the printed circuit proximate to an aperture 55 in the circuit board 11. Pads 51, 52 are normally electrically isolated from one another.

An attachable conductive member 57 may then be provided for establishing an electrical connection between pads 51, 52. For example, an aluminum or otherwise conductive rivet may be inserted into aperture 55 and engaged (such as by expansion) with the circuit board 11. In a particularly preferred embodiment, duplicate pairs of contact pads are provided on either side of circuit board 11 and electrically joined, so that a successful electrical connection may be made by the conductive member 57 on either the top or bottom surface of the circuit board 11 (or both). Other forms of attachable conductive members 57 may similarly be employed, such as (without limitation) bolts, screws, or clips designed to mechanically engage the circuit board 11 and provide a path of electrical continuity between pads 51, 52. Such members provide semi-permanent functional coupling of the pads 51, 52 and will remain in place until purposefully removed (if desired).

Figure 2:
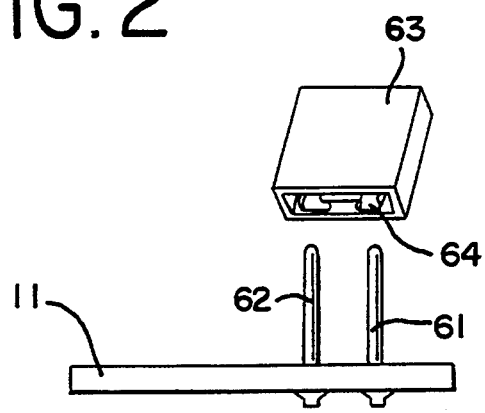
FIG. 2 is a side view of an alternative embodiment for a secondary circuit closure which may be used in connection with the invention.

FIG. 2 illustrates a further representative embodiment wherein the first and second conductive elements comprise pins 61, 62 functionally coupled to contacts 31, 32. A jumper 63 including an electrical connector 64 for establishing a current path between pins 61, 62 may then be provided. By attaching the jumper 63, a current path is established between the battery 12 and the electronic devices 13 independent of first and second connectors 30, 40, thereby allowing the second connector to be disengaged without removing electrical power from the memory devices.

Finally, temporary solder pads 53, 54 may also be provided and functionally coupled to contacts 31, 32. In this embodiment, a jumper wire may be soldered between the pads 53, 54 to provide an alternate current path in parallel with the principal connection described above, to similarly provide a secondary current path independent of connectors 30, 40.

While this invention has been shown and described in conjunction with preferred embodiments, it is apparent that certain changes and modifications, in addition to those mentioned above, may be made from the basic features of the present invention. Accordingly, it is the intention of applicant to protect all variations and modifications within the true spirit and valid scope of the present invention.

I claim:

1. In combination with an electronic unit including one or more electronic devices, a secondary power source for powering at least some of the electronics devices when a primary power supply is nonfunctional, and a first connector for permitting electrical coupling to an external device, the improvement comprising:

said first connector located on said electronic unit comprising a plurality of contacts including a first pair of contacts and a second pair of contacts, said first pair of contacts including a first and second contact, said first contact functionally coupled to a first pole of said secondary power source, said secondary power source having a second pole coupled to the at least one electronic device, said second contact functionally coupled to the corresponding input for secondary power associated with at least one of said electronic device, but isolated from said first contact such that an open circuit is presented between said secondary power source and said at least one electronic device when said first connector is in an unmated condition;

a second connector not located an said electronic unit adapted to matingly cooperate with said first connector, said second connector comprising a plurality of mating contacts including a first pair of mating contacts and a second pair of mating contacts, said first pair of mating contacts including a first mating contact and a second mating contact wherein said first and second mating contacts of said second connector are functionally coupled together and said second pair of mating contacts are coupled with at least said primary power source, so that when said second connector is mated with said first connector, said first and second mating contacts of said second connector electrically engage said first and second contacts of said first connector respectively to provide a current path between said first and second contacts, and said second pair of mating contacts of said second connector electrically engage said second pair of contacts of said first connector thereby simultaneously connecting said secondary power source to said at least one electronic device and said primary power source to said electronic unit.

2. The apparatus of claim 1 wherein said electronics unit comprises a circuit board, and said first connector comprises printed circuit edge board connector pads.

3. The apparatus of claim 1 wherein said at least one electronic device comprise electronic memory requiring an electrical power source for memory retention.

4. The apparatus of claim 1 further comprising secondary means for circuit closure in parallel with said first and second contacts.

5. The apparatus of claim 4 wherein said secondary means for circuit closure comprises a first conductive element functionally coupled to said first contact, a second conductive element functionally coupled to said second contact, and an attachable conductive member for functionally coupling said first and second conductive elements.

6. The apparatus of claim 5 wherein said electronics unit comprises a circuit board, and wherein said first and second conductive elements comprise contact pads.

7. The apparatus of claim 6 further comprising an aperture in said circuit board, said contact pads positioned proximate to said aperture, and said attachable conductive member adapted to pass through and cooperate with said aperture to secure said conductive member semi-permanently to said circuit board while functionally coupling said contact pads.

8. A method of simultaneously coupling a primary power source to an electronic unit and a secondary power source to one or more electronic devices of an electronic unit comprising the steps of:

providing a first connector located on said electronic unit having a plurality of contacts including a first pair of contacts and a second pair of contacts, said first pair of contacts including a first and second contact, wherein said secondary power source has a first pole coupled to said first contact and a second pole coupled to at least one electronic device and said second contact is coupled to a corresponding input for secondary power associated with the at least one electronic device and an open circuit exists between said first and second contacts of said first connector when said first connector is in an unmated condition;

providing a second connector not located on said electronic unit having a plurality of mating contacts including a first pair of mating contacts and a second pair of mating contacts, said first pair of mating contacts including a first mating contact and a second mating contact, wherein said first mating contact is coupled to said second mating contact and said second pair of mating contacts is coupled to at least said primary power source; and mating said second connector to said first connecter so that said first and second mating contacts of said second connector electrically engage said first and second contacts of said first connector and said second pair of mating contacts engage said second pair of contacts thereby simultaneously connecting said secondary power source to the at least one electronic device and said primary power source to said electronic unit.

9. The method of claim 8 further comprising the additional steps of:

supplying a secondary means for circuit closure in parallel with said first and second contacts, said secondary means for circuit closure comprising a first conductive element functionally coupled to said first contact, a second attachable conductive element functionally coupled to said second contact, and an attachable conductive member;

attaching said attachable conductive member such that an electrical contact is maintained between said conductive member and both said first and second conductive elements; and thereafter demating said first and second connectors.

* * * * *

UNITED STATES PATENT AND TRADEMARK OFFICE
CERTIFICATE OF CORRECTION

PATENT NO. : 5,402,008
DATED : March 28, 1995
INVENTOR(S) : Pamela M. St. John

It is certified that error appears in the above-indentified patent and that said Letters Patent is hereby corrected as shown below:

In Claim 1, column 7, line 36, "an" should read ---on---

In Claim 8, column 8, line 44, "connecter" should read ---connector---

In Column 7, line 16, "electronics" should read ---electronic---

In Claim 9, line 59, after "second" delete ---attachable---

In Claim 9 line 64, before "conductive" insert ---attachable---

Signed and Sealed this

First Day of August, 1995

Attest:

BRUCE LEHMAN

*Attesting Officer*  *Commissioner of Patents and Trademarks*